United States Patent [19]
Abe et al.

[11] Patent Number: 5,306,925
[45] Date of Patent: Apr. 26, 1994

[54] NONLINEAR OPTICAL ELEMENT AND METHOD OF USING THE SAME

[75] Inventors: Yuji Abe; Yasunori Tokuda, both of Hyogo, Japan

[73] Assignee: Mitsubishi Denki Kabushiki Kaisha, Tokyo, Japan

[21] Appl. No.: 17,296

[22] Filed: Feb. 12, 1993

[30] Foreign Application Priority Data

Apr. 15, 1992 [JP] Japan .................. 4-122742

[51] Int. Cl.⁵ .......................... H01L 33/00
[52] U.S. Cl. ........................ 257/21; 257/184; 257/458; 257/656
[58] Field of Search ............. 257/21, 184, 458, 656

[56] References Cited

U.S. PATENT DOCUMENTS 5,229,622 7/1993 Cavailles ................. 251/21

OTHER PUBLICATIONS

David A. B. Miller, "The Quantum Well-Self-Electrooptic Effect Device: Optoelectronic Bistability and Oscillation, and Self-Linearized Modulation", IEEE Journal of Quantum Electronics, vol. QE-21, No. 9, Sep. 1985, pp. 1462-1476.

Primary Examiner—Edward Wojciechowicz
Attorney, Agent, or Firm—Burns, Doane, Swecker & Mathis

[57] ABSTRACT

According to the present invention, there is provided a nonlinear optical element including a p-i-n type photodiode (i layer is a light absorbing layer) provided with a barrier layer preventing the going-through of a majority carrier. In the nonlinear optical element of the present invention, since the charges are accumulated with the stop of carrier moving, there occur a deformation in energy band and change in internal electric field. Optical bistability can be attained even without an external circuit. Further, with a plurality of incident light, only one element can exhibit optical bistability therefor because there is no need to dispose an external circuit. According to a method of the present invention, it is possible to control bistability for one light by overlapping another light input to a carrier diffusing region generated by the one light.

8 Claims, 10 Drawing Sheets

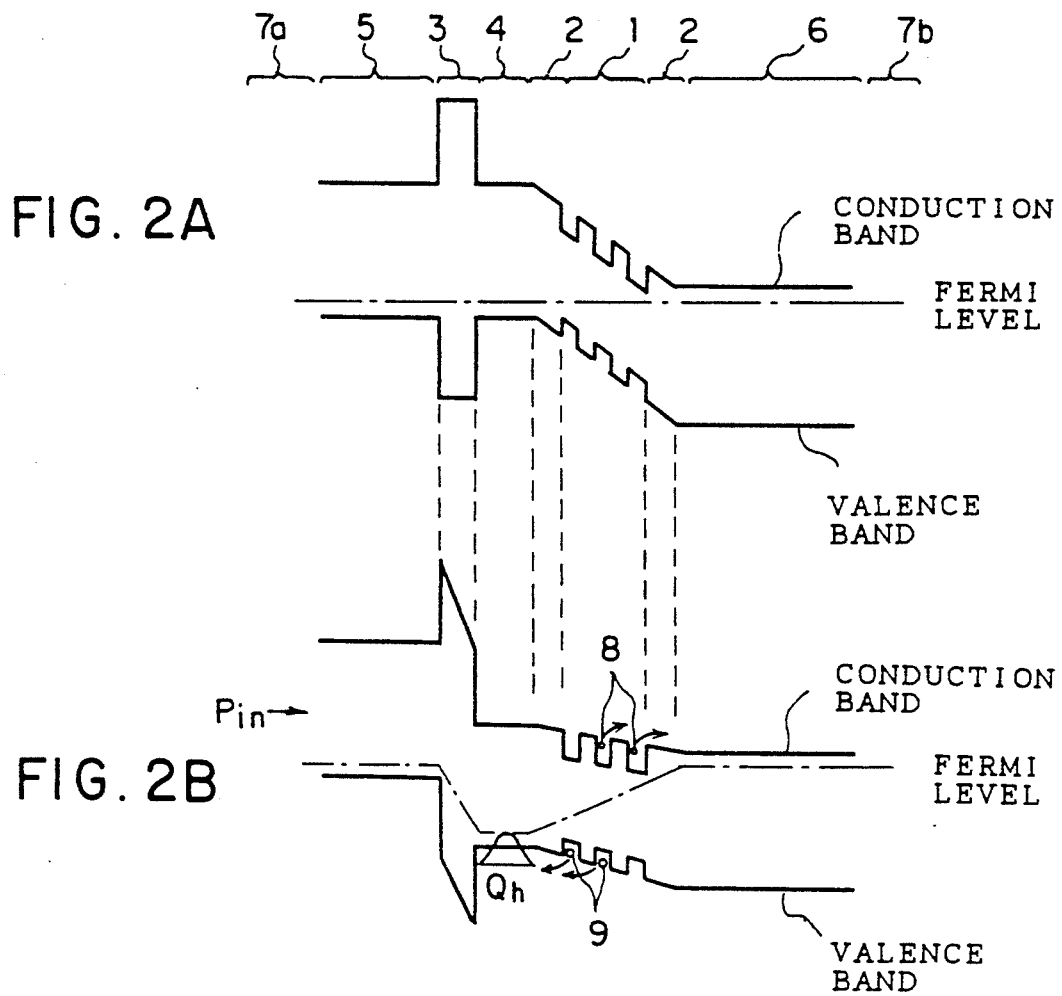
FIG. 2A
FIG. 2B
FIG. 3
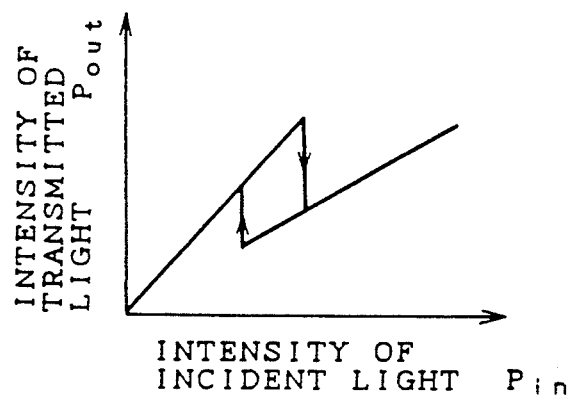

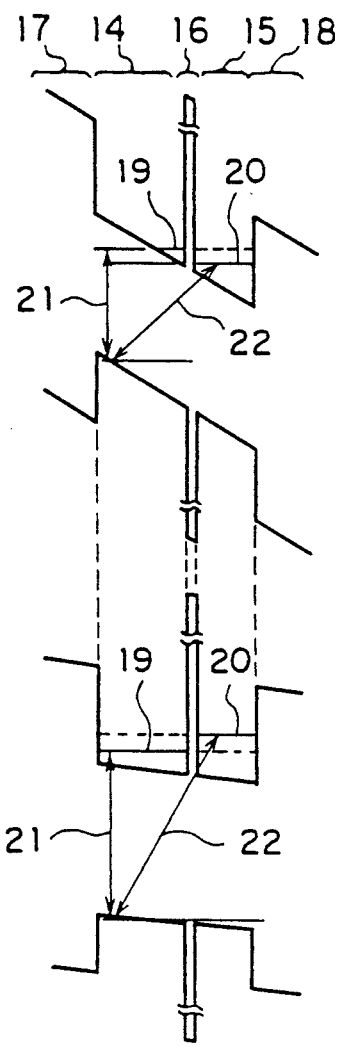
FIG. 8A
FIG. 8B
FIG. 9
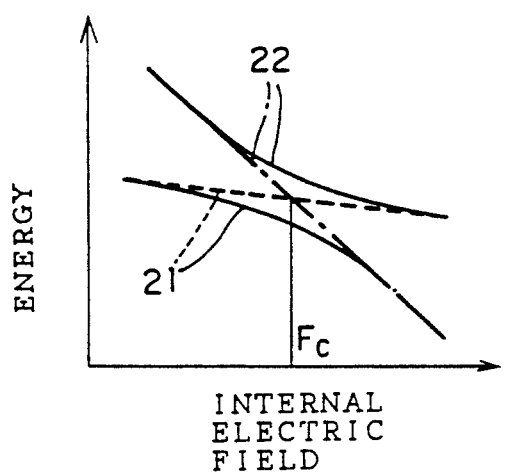

NONLINEAR OPTICAL ELEMENT AND METHOD OF USING THE SAME

BACKGROUND OF THE INVENTION

1. Field of the Invention

The present invention relates to a nonlinear optical element for use in an optical information processing system, e.g. an optical computer. The present invention is further concerned with a method of using such a nonlinear optical element as an optical bistable element for a logic element or a memory element, as in such optical computer or the like.

2. Prior Art

FIG. 16 is a conceptual diagram illustrating a conventional optical bistable device which has been referred to in David A. B. Miller et al. in IEEE Journal of Quantum Electronics, Vol. QE-21, No. 9 (1985), pp. 1462-1476. In the same figure, the reference numeral 1 denotes an AlGaAs/GaAs multiple quantum well layer. On each of the upper and lower surfaces of the multiple quantum well layer 1 there is disposed a non-doped (i-type) AlGaAs layer 2. A p-type AlGaAs layer 5 is formed on the non-doped AlGaAs layer 2 which is disposed on the upper surface side of the multiple quantum well layer 1, while an n-type AlGaAs layer 6 is formed on the lower surface of the non-doped AlGaAs layer 2 which is disposed on the lower surface side of the layer 1. On the upper surface of the p-type AlGaAs layer 5 and on the lower surface of the n-type AlGaAs layer 6 there are provided upper electrodes 7a and lower electrodes 7b, respectively. An external power source 31 is connected between electrodes 7a and 7b, and an external resistor 30 having a resistance value of R is connected between the electrode 7a and the external power source 31.

FIG. 17 is a diagram for explaining the operation of the device illustrated in FIG. 16, and FIG. 18 is a characteristic diagram showing a relation between an incident light intensity $P_{in}$ and a transmitted light intensity $P_{out}$ in that device.

The operation will now be described. In the conventional optical bistable device, which is constructed as above, a reverse bias $V_{ex}$ is applied to the p-i-n photodiode from the external power source 31 via the external resistor 30 having the resistance R. The multiple quantum well layer 1 located in the interior of the photodiode has a sharp absorption spectrum due to excitation absorption corresponding to a transition between quantum levels. The peak of the absorption spectrum can be shifted by changing the internal electric field. That is to say, the absorption factor with respect to the wavelength of a certain incident light in the multiple quantum well layer 1 has a peak in a certain internal electric field.

Light incident on the photodiode is absorbed in the multiple quantum well layer 1 and there flows a photocurrent I proportional thereto. The solid curve in FIG. 17 represents a relation between a voltage V which is applied to the photodiode and a light absorption factor S of this photodiode under the condition of no external resistor. As can be seen from this curve, the light absorption factor has some peaks at specific values of voltage V applied to the photodiode. In the external resistor 30 included in the circuit of FIG. 16, there occurs a voltage drop for the photocurrent I and the (internal) voltage V applied to the photodiode changes from $V_{ex}$ to $V_{ex}-IR$. That is, $$V = V_{ex} - IR \tag{1}$$

On the other hand, the relation between the photocurrent I and the absorption factor S is obtained as:

$$I = \alpha S P_{in} \tag{2}$$

where $\alpha$ is a proportion constant and $P_{in}$ represents an incident light intensity.

From the equations (1) and (2), the absorption factor S is obtained as:

$$S = (V_{ex} - V)/\alpha R P_{in}$$

Thus, in the relation to the voltage V, the absorption factor S can be represented by a straight line whose gradient becomes smaller with increase of the incident light intensity $P_{in}$. The straight broken lines A to D in FIG. 17 represent this relation in the equation (2) for different incident light intensities $P_{in}$, wherein in one hand the straight line A is obtained when the incident light intensity $P_{in}$ is the lowest, and on the other hand the straight line D is obtained at the highest incident light intensity $P_{in}$. Actual operation points under the incidence of light are represented by intersection points between such straight lines and the foregoing curve.

The straight lines A and D each have only one intersection point with respect to the curve representing the V-S relation, while between the straight lines B and C there are obtained three intersecting points. Of these three intersection points, the central point is an unstable point. The other two, however, are stable points. That is, bistable characteristics are shown between the straight lines B and C. As illustrated in FIG. 18, two different optical outputs, i.e. bistable characteristics, are obtained in a certain incident light intensity $P_{in}$ range.

In the above construction of the conventional optical bistable device, it is necessary to provide an external circuit including external resistor and power source. Further, feedback is performed using an electric current which has been taken out to the exterior. Thus, when it is desired to obtain bistable characteristics between plural incident lights and plural transmitted lights, there has been a complicated problem that element isolation is required and an external circuit is needed in each of the isolated regions made by the element isolation.

SUMMARY OF THE INVENTION

The present invention has been accomplished for overcoming the above-mentioned problems and it is an object of the invention to provide a nonlinear optical element which can afford optical bistable characteristics without using an external circuit and without element isolation, as well as a method of using the same.

In one aspect of the present invention there is provided a nonlinear optical element using a p-i-n photodiode structure which includes a quantum well structure as a light absorbing layer (i layer) characterized in that the nonlinear optical element is provided with a barrier layer for obstructing conduction of a majority carrier which is generated in the light absorbing layer and transmitted through each doped layer (p and n layers), the barrier layer being formed in either or both of p- and n-type doped layers, and is also provided with electrodes for short-circuiting the p- and n-type doped layers.

In another aspect of the present invention there is provided a nonlinear optical element using a p-i-n photo-diode structure which includes a quantum well structure as a light absorbing layer characterized in that this nonlinear optical element is provided with a barrier layer which is formed in either or both of p- and n-type doped layers and which changes switchwise conduction of a majority carrier generated in the light absorbing layer and transmitted through each doped layer, in accordance with a change in the magnitude of an electric field applied to the barrier layer, and is also provided with electrodes for short-circuiting the p- and n-type doped layers.

In a further aspect of the present invention there is provided a method of using the above two nonlinear optical element comprising inputting one or more beam-like light to a region where carriers generated by absorption of other beam-like light are spread by diffusion.

The magnitude of an electric field applied to the light absorbing layer is changed by a band deformation caused by interception and accumulation of a majority carrier in presence of the barrier layer, to obtain bistable characteristics regarding incident light of a predetermined intensity. Therefore, an external circuit is not needed and it is possible to obtain optical bistable characteristics without element isolation.

In the second aspect of the present invention, the magnitude of the electric field applied to the barrier layer is changed with a band deformation caused by interception and accumulation of the carriers in presence of the barrier layer, allowing the conductivity of the carriers to be changed switchwise so as to obtain bistable characteristics. Therefore, it is not necessary to use an external circuit and there can be obtained optical bistable characteristics. Further, also in case small is the change in light absorption caused by change in magnitude of the electric field applied to the light absorbing layer, there can be obtained optical bistable characteristic.

In the third aspect of the present invention, a bistable characteristic for a first light can be controlled by another light which is input into a place slightly spaced from the first light.

BRIEF DESCRIPTION OF THE DRAWINGS

FIGS. 2A and 2B are energy band diagrams for explaining the operation of the nonlinear optical element shown in FIG. 1;

FIG. 3 is a characteristic diagram showing a relation between incident light intensity and transmitted light intensity in the nonlinear optical element of FIG. 1;

FIGS. 8A and 8B are energy band diagrams for explaining the operation of a nonlinear optical element according to a fourth embodiment of the present invention;

FIG. 9 is a diagram showing changes of an optical transition energy with respect to an internal electric field of the nonlinear optical element according to the fourth embodiment;

DETAILED DESCRIPTION OF THE PREFERRED EMBODIMENTS

Embodiments of the present invention will be described hereinunder with reference to the accompanying drawings.

EXAMPLE 1

Figure 1:
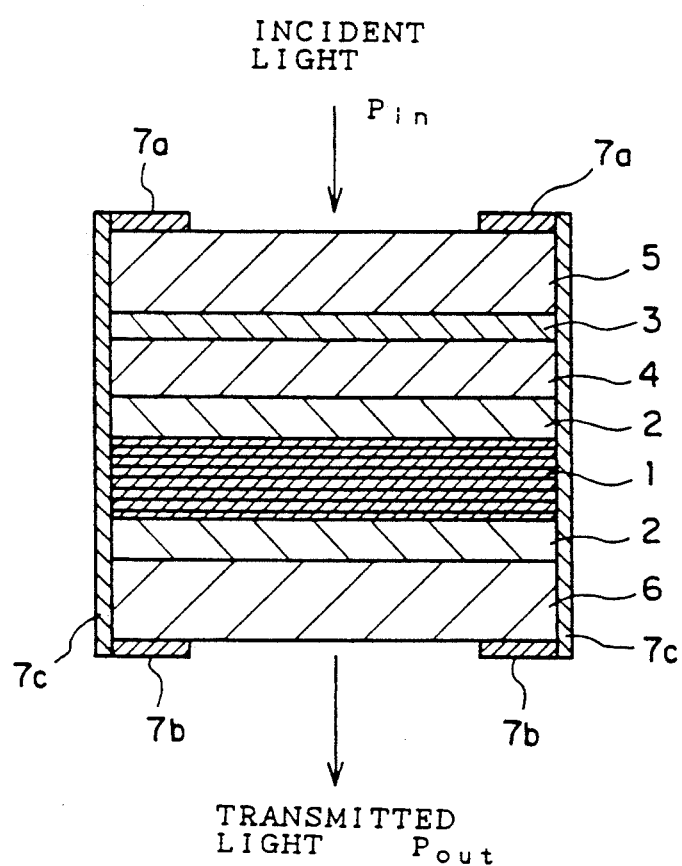
FIG. 1 is a sectional view showing a nonlinear optical element according to a first embodiment of the present invention.

FIG. 1 is a sectional view showing a nonlinear optical element according to example 1 of the present invention; FIG. 2A is an energy band diagram in the absence of light input in the nonlinear optical element of FIG. 1; and FIG. 2B is an energy band diagram in the presence of a light input $P_{in}$.

In FIG. 1, the reference numeral 1 denotes an AlGaAs/GaAs multiple quantum well layer. A non-doped AlGaAs layer 2 is disposed on each of the upper and lower surfaces of the multiple quantum well layer 1. A p-type AlGaAs layer 4 is disposed on the non-doped AlGaAs layer 2 formed on the upper surface side of the multiple quantum well layer 1. Further, a non-doped AlAs layer 3 is formed on the p-type AlGaAs layer 4, and a p-type AlGaAs layer 5 is formed on the AlAs layer 3.

On the other hand, an n-type AlGaAs layer 6 is disposed on the lower surface of the non-doped AlGaAs layer 2 formed on the lower surface side of the multiple quantum well layer 1. On the upper surface of the p- type AlGaAs layer 5 and the lower surface of the n-type AlGaAs layer 6 there are provided upper electrodes 7a and lower electrodes 7b, respectively. The upper and lower electrodes 7a, 7b are short-circuited by short-circuit electrodes 7c. In FIGS. 2A and 2B, the same reference numerals as in FIG. 1 represent the same portions as in FIG. 1, and the numerals 8 and 9 represent electrons and holes, respectively.

The operation will now be described. Upon incidence of light $P_{in}$ having a certain wavelength, the light is absorbed in the AlGaAs/GaAs multiple quantum well layer 1, whereby electrons 8 and holes 9 are excited. Since the energy level of layer 1 is inclined as in FIG. 2A by a built-in field (an electric field based on a contact potential difference of p-i-n unction), the electrons 9 move toward the n-type AlGaAs layer 6, while the holes 9 move toward the p-type AlGaAs layer 5.

In the n-type AlGaAs layer 6 there is nothing that obstructs the conduction of the electrons 8, so the electrons reach the electrodes 7b. On the other hand, the holes 9 are obstructed by the non-doped AlAs layer 3 which acts as a barrier, so that the holes stay in the p-type AlGaAs layer 4, which layer is charged up by the charge $Q_h$ on the holes.

Although the p- and n-type AlGaAs layers 5, 6 are coincident in Fermi level with each other because they are short-circuited by the electrodes 7c as shown in FIG. 2B, the Fermi level of the p-type AlGaAs layer 4 drops because it is charged up by the charge $Q_h$ (and because there is little electric conduction to the electrode 7c side although the p-type AlGaAs layer 4 is in contact with the electrodes 7c), and there occurs a deformation of energy band. That is, the built-in field imposed on the multiple quantum well layer 1 is screened (biased in a cancelling direction) by the charge $Q_h$, so that the gradient of the band becomes smaller in layer 1.

As noted previously in connection with the prior art, the multiple quantum well layer 1 has a sharp absorption spectrum based on an excitation absorption corresponding to the transition between quantum levels, and due to a so-called quantum confining Stark effect, the peak of the absorption spectrum shifts to the shorter wavelength side with decrease of an internal electric field (a modification of the built-in field). Suppose that light having a wavelength shorter than the absorption peak in the multiple quantum well layer 1 on which imposed is the built-in field in the absence of light input, is applied to the nonlinear optical element of this example. The number of electrons 8 and holes 9 which are generated by the absorption of light is small in case the incident light intensity is fairly low, and the electric charge $Q_h$ which stays in the p-type AlGaAs layer 4 is also small, so the deformation of energy band, namely, the amount of the built-in field which is screened, is also small. That is, there is little difference from the built-in field in the absence of light input, so the amount of light absorbed remains small.

A slight increase in the incident light intensity causes an increase in the number of electrons 8 and holes 9 which are generated by the absorption of light, so that the electric charge $Q_h$ accumulated in the p-type AlGaAs layer 4 also increases. As a result, the energy band is deformed and the built-in field is screened to decrease the internal electric field. Since the decrease of the internal electric field causes the absorption peak to shift to the short wavelength side, the wavelength of the incident light approaches the absorption peak and the amount of light absorbed increases. Since this increase in the amount of light absorbed also causes an increase in the amount of electrons 8 and holes 9 which are excited, the electric charge $Q_h$ accumulated in the p-type AlGaAs layer 4 increases and the built-in field is further screened to decrease the internal electric field. And there occurs a positive feedback such that the decrease of the internal electric field brings about a further increase in the amount of light absorbed. As a result, the relation between the incident light intensity $P_{in}$ and $P_{out}$ achieves such a bistable characteristic as shown in FIG. 3.

Thus, according to this example, the barrier layer 3, which obstructs the conduction of holes generated in the light absorbing layer, is provided in the p-type doped layer of a p-i-n photodiode having a light absorbing layer of a quantum well structure, and the p- and n-type doped layers 5, 6 are short-circuited. Consequently, it is possible to realize optical bistable characteristics without providing an external circuit.

Although in the above embodiment the barrier layer is provided in the p-type doped layer to obstruct the conduction of holes as a majority carrier, the barrier layer may be provided in the n-type doped layer to obstruct the conduction of electrons. Further, barrier layers may be formed in both of the p- and n-type doped layers to obstruct the conduction of both holes and electrons.

In the above example 1 simply using a carrier conduction preventing layer as the barrier layer, there occurs a phenomenon such that once an electric charge accumulates in the barrier layer, an electric field is applied to the barrier layer, so the accumulation of electric charge becomes difficult. To avoid this phenomenon, in other words, for allowing the foregoing positive feedback to generate to a satisfactory extent, some consideration is needed, for example, enlarging the change in the amount of light absorbed upon change in the internal electric field of the multiple quantum well layer 1 so as to compensate for the difficulty in the accumulation of electric charge. On the other hand, such consideration will become unnecessary if there is used as the barrier layer a layer capable of changing the conduction of many carriers switchwise in accordance with a change in voltage across the barrier layer.

EXAMPLE 2

Figure 4:
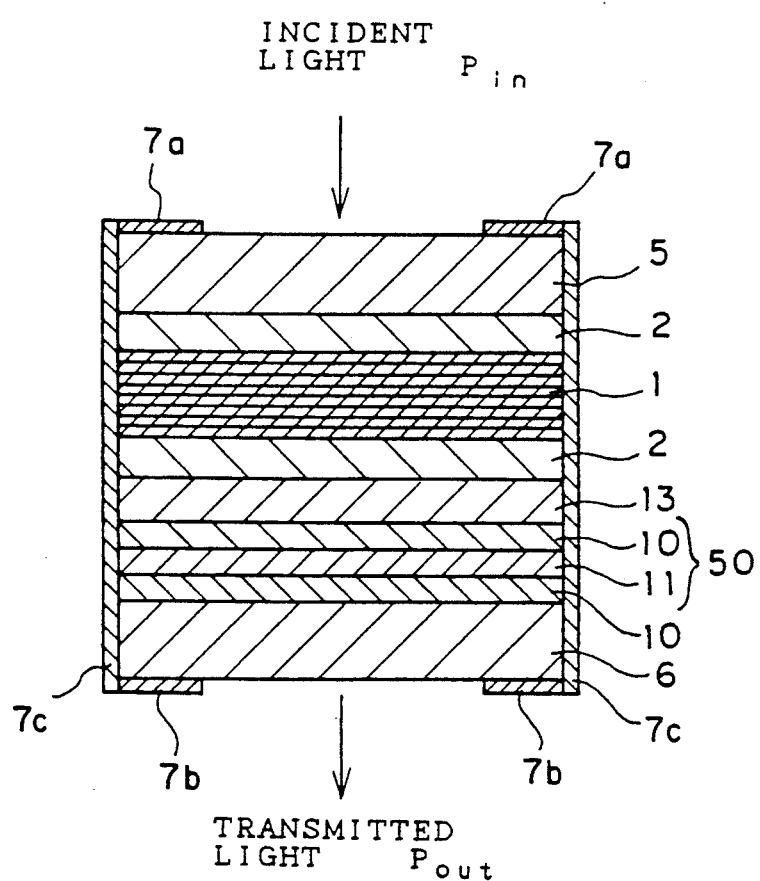
FIG. 4 is a sectional view showing a nonlinear optical element according to a second embodiment of the present invention.

FIG. 4 is a sectional view of an optical bistable element according to example 2 of the present invention in which there is provided a layer capable of changing the conduction of majority carriers switchwise (i.e. nonlinearly) in accordance with a change in voltage across a barrier layer. In the same figure, the same reference numerals as in FIG. 1 represent the same components as in FIG. 1. A double barrier layer 50 comprising a non-doped AlGaAs layer 11 and two non-doped AlAs layers 10, disposed in a sandwiching relation to the layer 11, is disposed on an n-type AlGaAs layer 6, and an n-type AlGaAs layer 13 is formed on the double barrier layer 50.

The composition and thickness of each of the non-doped AlAs layers 10, non-doped AlGaAs layer 11 and n-type AlGaAs layer 13 are set so that, under a predetermined voltage across the two ends of the double barrier layer 50, the energy of electrons reaching the double barrier layer 50 becomes equal to the energy of a quantum level generated by the double barrier which comprises the layers 10 and 11 and so that it becomes easier for the electrons to pass through the double barrier layer 50 under a resonant tunneling effect.

Figure 5A:
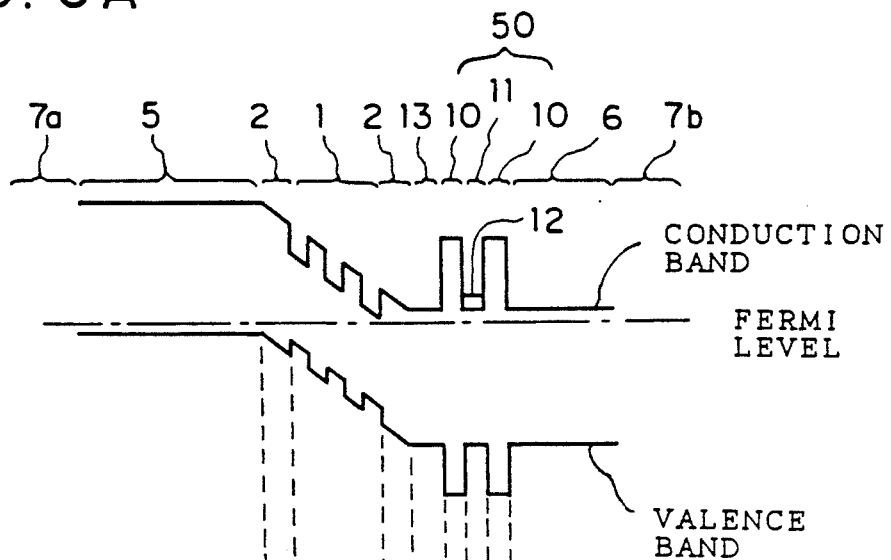
FIGS. 5A, 5B and 5C are energy band diagrams for explaining the operation of the nonlinear optical element shown in FIG. 4.
Figure 5B:
Figure 5C:
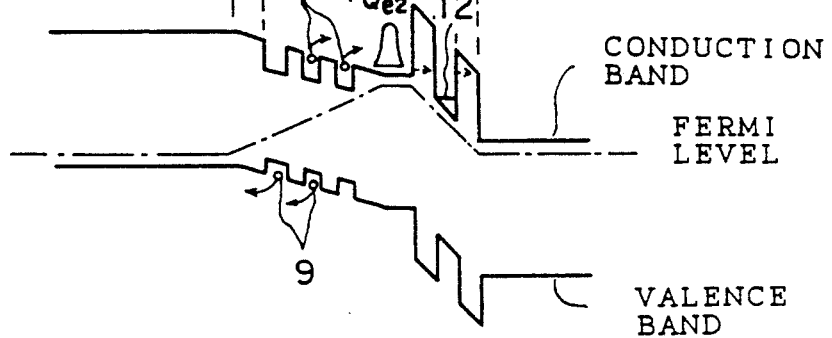

FIG. 5A is an energy band diagram in the absence of light input in the nonlinear optical element of FIG. 4 having a double barrier layer as a barrier, layer wherein a resonant tunneling effect is created for carriers; FIG. 5B is an energy band diagram in the case of a low incident light intensity; and FIG. 5C is an energy band diagram in the case of a high incident light intensity. In these figures, the same reference numerals as in FIG. 4 represent the same components as in FIG. 4, and the numeral 12 denotes a quantum level generated by the double barrier layer 50 comprising non-doped AlAs layers 10 and a non-doped AlGaAs layer 11.

The operation will now be described. Upon incidence of a light $P_{in}$ of certain wavelength like example 1, the light is absorbed in the AlGaAs/GaAs multiple quantum well layer 1, whereby electrons 8 and holes 9 are excited. Since the layer 1 is inclined by a built-in field as in FIG. 5A, the electrons 8 move toward the n-type AlGaAs layer 13, while the holes 9 move toward the p-type AlGaAs layer 5. Since in the layer 5 there is nothing that obstructs the conduction of the holes 9, the holes pass through the p-type doped layer 5 and reach the electrodes 7a. On the other hand, the electrons 8 are obstructed by the double barrier layer 50 comprising non-doped AlAs layers 10 and a non-doped AlGaAs layer 11, so that the electrons are accumulated in the n-type AlGaAs layer 13 and the electric charge thereof causes the layer 13 to be charged up to a certain potential.

Since the p-type AlGaAs layer 5 and the n-type AlGaAs layer 6 are short-circuited by the electrodes 7c, both are coincident in Fermi level, but the Fermi level of the n-type AlGaAs layer 13 rises because it is charged up by a negative electric charge in this case, so that the energy band is deformed as shown in FIG. 5B or 5C.

Consideration will now be given about the case where the incident light intensity is low. In this case, a slight electric charge $-Q_{el}$ causes a band deformation and a slight electric field is applied across the double barrier layer 50. In this connection, if the double barrier layer 50 is adjusted so that the energy of the electrons reaching the double barrier layer 50 becomes equal to that of the quantum level 12, it becomes easier for the electrons to pass through the double barrier layer 50 due to a resonant tunneling effect. That is, the state of a reduced shifting charge caused by the double barrier layer 50 is kept stable to some extent.

Next, when the incident light intensity is somewhat increased, the number of electrons 8 and holes 9 which are generated by the absorption of light also increases, thus resulting in increase in the amount of electric charge accumulated in the n-type AlGaAs layer 13. Consequently, the energy band is further deformed, and the electric field applied across the double barrier layer 50 becomes larger as shown in FIG. 5C, so that the energy of the electrons reaching the double barrier layer 50 becomes larger than that of the quantum level 12 and the resonance condition is weakened. As a result, the electrons which have reached the double barrier layer 50 hardly passes through the same layer 50. Once it becomes difficult for the electrons to pass through the double barrier layer 50, the amount of the electric charge accumulated in the n-type AlGaAs layer 13 further increases and the electric field applied across the double barrier layer 50 becomes larger. Consequently, the resonance condition is further weakened and hence there occurs a positive feedback such that it becomes more difficult for the electrons to pass through the double barrier layer 50.

In the previous example 1, a positive feedback is allowed to occur by utilizing the phenomenon that the amount of light absorbed in the multiple quantum well layer 1 changes upon change of the internal electric field, while this example 2 utilizes the phenomenon that the conduction characteristic of the carriers in the barrier layer portion is changed by a change in electric field, and hence there occurs such positive feedback even if the amount of light absorbed in the multiple quantum well layer 1 does not change upon change of the internal electric field. Thus, unlike the example 1, the amount of light absorbed in the layer 1 need not undergo an abrupt change upon change of the internal electric field. However, it goes without saying that in order for the relation between incident light intensity $P_{in}$ and transmitted light intensity $P_{out}$ to exhibit a bistable characteristic, a certain change in the amount of light absorbed in the multiple quantum well layer 1 should occur upon change of the internal electric field.

Figure 6A:
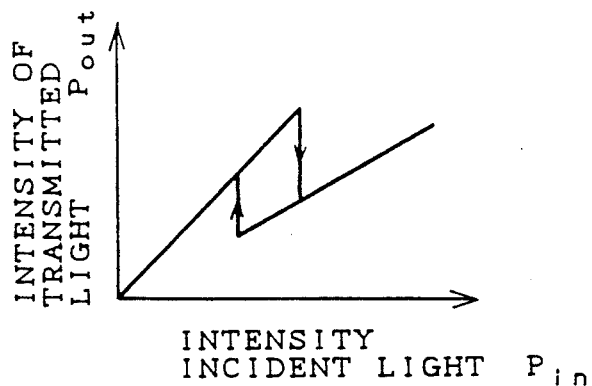
FIGS. 6A and 6B are characteristic diagrams showing relations between incident light intensity and transmitted light intensity of the nonlinear optical element of FIG. 4 operated under different wavelength from each other.
Figure 6B:
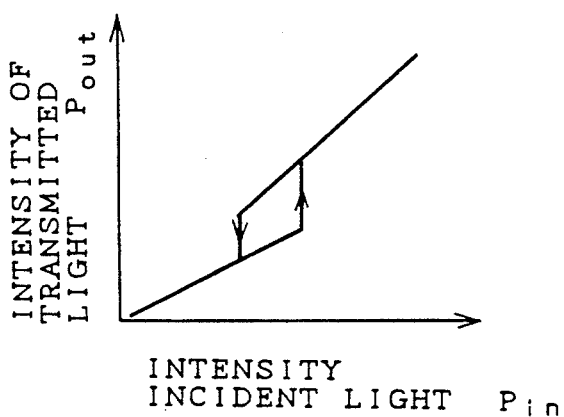

Another feature of the nonlinear optical element of this example 2 is that whether such a characteristic as shown in FIG. 6A is obtained, or such a characteristic as shown in FIG. 6B is obtained, depends on whether the amount of light absorbed increases or decreases upon decrease of the internal electric field applied to the multiple quantum well layer 1. Therefore, the direction of such change (increase or decrease) in the amount of light absorbed which is caused by a change in the internal electric field can be varied by changing the wavelength of incident light even in the same multiple quantum well structure, so that different logic characteristics can be obtained by using different wavelengths of lights in the same nonlinear optical element.

Although in the above embodiment the barrier layer is provided in the n-type doped layer to switchwise change the conduction of electrons as a majority carrier, the barrier layer may be disposed in the p-type doped layer to change the conduction of holes switchwise. Further, the barrier layer may be provided in each of the p- and n-type doped layers to switchwise change the conduction of both holes and electrons.

EXAMPLE 3

Figure 7:
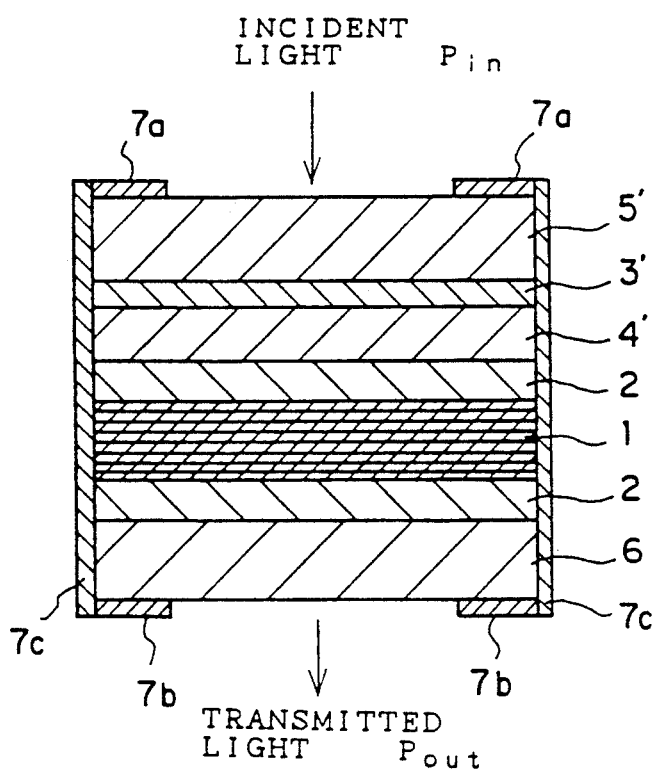
FIG. 7 is a sectional view showing a nonlinear optical element according to a third embodiment of the present invention.

FIG. 7 is a sectional view showing a nonlinear optical element according to example 3 of the present invention. In the same figure, the same reference numerals as in FIG. 1 represent the same components as in FIG. 1; further, the numeral 3' denotes a non-doped AlAs layer having a thickness of about 0.1 micron, and numerals 4' and 5' each denote a p-type AlGaAs layer having an Al composition ratio of 0.3.

The example 3 is the same as the previous example 1 except that the Al composition ratio in each of the p-type AlGaAs layers 4 and 5 is set at about 0.3 and the thickness of the non-doped AlAs layer 3 is set at about 0.1 $\mu$m. In this constitution, the conductivity of carriers does not undergo a simple (linear) change ohmically upon change in the voltage across the barrier layer 3', but it changes switchwise at a certain potential. Therefore, like the nonlinear optical element of the above example 2, the relation between incident light intensity $P_{in}$ and transmitted light intensity $P_{out}$ exhibits a bistable characteristic even if the amount of light absorbed in the multiple quantum well layer 1 does not undergo an abrupt change upon change of the internal electric field.

EXAMPLE 4

As one method for enlarging the change in the amount of light absorbed upon change of the internal electric field in the multiple quantum well layer 1, which is a condition required for realizing the nonlinear optical element of example 1, it is effective to use a coupled quantum well in place of the ordinary type of a quantum well as the light absorbing layer.

FIGS. 8A and 8B are energy band diagrams for explaining the operation of the optical element of this example which uses coupled quantum well layers as light absorbing layers, FIG. 8A being an energy band diagram of a set of coupled quantum well layers in the absence of light input and FIG. 8B being an energy band diagram of the coupled quantum well layers in a screened state of built-in field in the presence of light input, and FIG. 9 is a diagram showing changes in optical transition energy relative to changes in internal electric field in this nonlinear optical element.

In these figures, the numeral 14 denotes a wide GaAs quantum well layer; numeral 15 denotes a narrow GaAs quantum well layer; numeral 16 denotes an, AlGaAs tunnel barrier layer; numeral 17 denotes an AlGaAs layer closer to p side; and numeral 18 denotes an AlGaAs layer closer to n side. The coupled quantum well layers 14 and 15 are used in place of the multiple quantum well layer 1 shown in FIG. 1, and the AlGaAs layers 17 and 18 correspond to the AlGaAs layer 2 shown in FIG. 1. For example, as typical thicknesses of the layers 14 and 15, the wide GaAs quantum well layer 14 is 100 Å thick and the narrow GaAs quantum well layer 15 is 60 Å. Further, the thickness of the AlGaAs tunnel barrier layer 16 is 4 Å.

The numeral 19 denotes an electron energy level of n (principal quantum number)=1 in the wide quantum well layer 14 when considered as an isolated system; numeral 20 likewise denotes an electron energy level of n=1 in the narrow quantum well layer 15; numeral 21 denotes an optical transition between the electron energy level 19 of n=1 in the wider quantum well layer 14 and a heavy hole energy level of n=1 in the same layer; and numeral 22 denotes an optical transition between the electron energy level of n=1 in the narrow quantum well layer 15 and the heavy hole energy level of n=1 in the wide quantum well layer 14.

The operation will now be described. In the absence of light input, a built-in field is applied to the coupled quantum well layers 14 and 15 as in FIG. 8A, but as the incident light intensity is increased, the built-in field is screened (inclination of energy level is lessened) and the band changes as shown in FIG. 8B, like the example 1. At this time, the up-down relation between the electron level 19 of n=1 in the wide quantum well layer 14 and the electron level 20 of n=1 in the narrow quantum well layer 15 reverses.

Thus, the optical transitions 21 and 22 in which the levels 19 and 20 are concerned are changed by the internal electric field as indicated by broken line and dot-dash line in FIG. 9. That is, at a certain internal electric field $F_c$, the electron level 19 of n =1 in the wide quantum well layer 14 and the electron level 20 of n=1 in the narrow quantum well layer 15 coincide with each other. In this case, if the coupling between the two quantum well layers 14 and 15 is sufficiently strong, the respective wave functions will mix together and the two quantum levels will repulse to each other strongly in the vicinity of the internal electric field $F_c$ in which the level coincidence ought to be attained. That is, an anti-crossing characteristic is so exhibited for those levels and there arise such changes as indicated by solid lines in FIG. 9. Consequently, the change in absorption peak in the combined quantum well becomes larger than that (corresponding to the broken line in FIG. 9) based on a quantum confining Stark effect in the ordinary type of a quantum well.

Further, since the optical transitions 21 and 22 share with each other in the vicinity of the internal electric field $F_c$ in which the two levels 19, 20 coincide with each other, the oscillator strength decreases (i.e. the intensity of absorption peaks relating to the optical transitions 21 and 22 lowers) in the ordinary type of quantum well. With these two effects, change in light absorption accompanying change in an internal electric field in a coupled quantum well is larger than that in an ordinary quantum well.

Such effect of this example to enlarge the change in the amount of light absorbed upon change of the internal electric field is effective in its application not only to example 1 but also to examples 2 and 3. More particularly, although in the examples 2 and 3 a bistable operation itself is developed by the effect of the barrier layer even when the change in the amount of light absorbed is small, a large change in the amount of light absorbed brings about advantages; for example, it permits enlarging the on-off ratio.

Although in the above example 4 there are used a set of coupled quantum well layers, there may be adopted having a plurality of such coupled quantum well layers, whereby there can be attained the same effects as in the example 4. Further, although the above example 4 adopted an asymmetric structure having different well layer thicknesses, there may be adopted an asymmetric structure having different well layer compositions the same effects as in the example 4.

EXAMPLE 5

The following description is now provided about embodiments of how to use the nonlinear optical elements of the invention described in the above examples 1 to 4.

Figure 10:
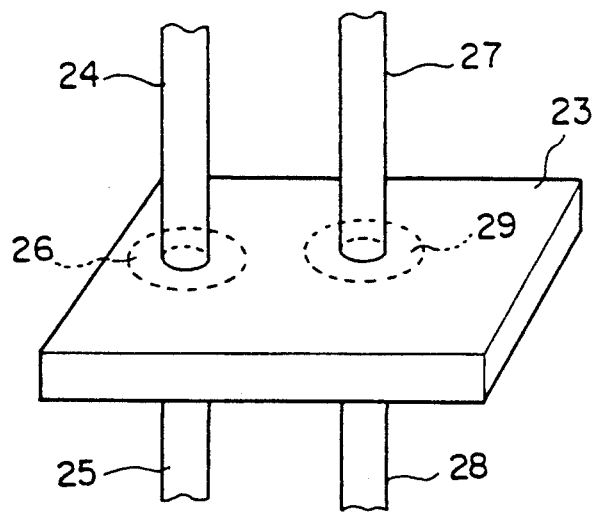
FIG. 10 is a schematic illustration showing a nonlinear optical element according to a fifth embodiment of the present invention.

FIG. 10 is a schematic illustration showing a method of using a nonlinear optical element according to example 5 of the present invention. In the same figure, the numeral 23 denotes a nonlinear optical element according to any of the above examples 1 to 4; the numeral 24 denotes a first incident light; numeral 25 denotes a first transmitted light corresponding to the first incident light 24 and numeral 26 denotes a region in which carriers generated by the absorption of the first incident light 2; have spread by diffusion. Further, the numeral 27 denotes a second incident light; numeral 28 denotes a second transmitted light corresponding to the second incident light 27; and numeral 29 denotes a region in which carriers generated by the absorption of the second incident light 27 have spread by diffusion.

Figure 11A:
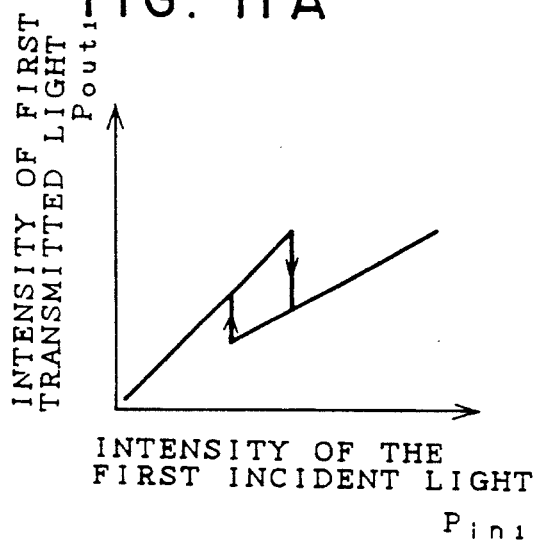
FIGS. 11A and 11B are characteristic diagrams each showing one relation between incident light intensity and transmitted light intensity in the nonlinear optical element according to the fifth embodiment.
Figure 11B:
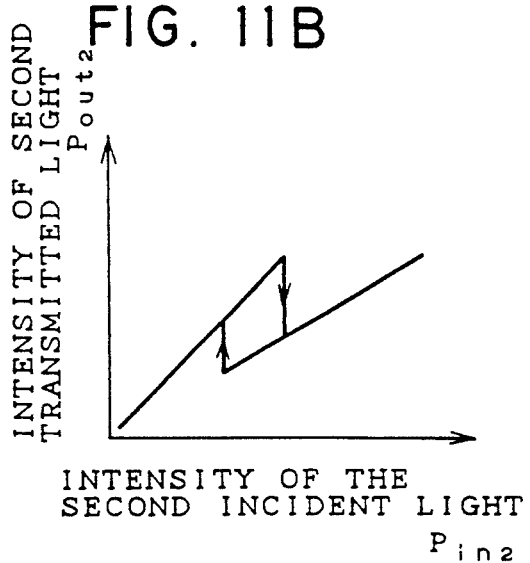

It is presumed that upon input of light having a certain spot diameter, carriers which are developed by the absorption of light will spread by diffusion to the direction traverse to the incident direction of the light over the light input portion. However, it is presumed that such transverse diffusion will be restricted to a certain range due to a correlation thereof with the amount of carriers passing through the barrier layer. Since the nonlinear optical element according to the present invention has a feedback mechanism in the interior thereof unlike the prior art, even if another light is input to a place where carriers generated by the absorption of a certain incident light are not diffused, it exerts no influence on the input-output relation of the previous incident light. More particularly, even without element isolation, as shown in FIG. 10, if the first and second incident lights 24, 27 are input over a certain distance from each other so as to prevent overlapping of the regions 26 and 29 in which the carriers generated by the absorption of the incidents lights 24 and 27 are diffused, there will be no influence of one upon the other input-output relation and there will be exhibited optical bistable operations independent on each other as shown in FIGS. 11A and 11B.

Figure 12A:
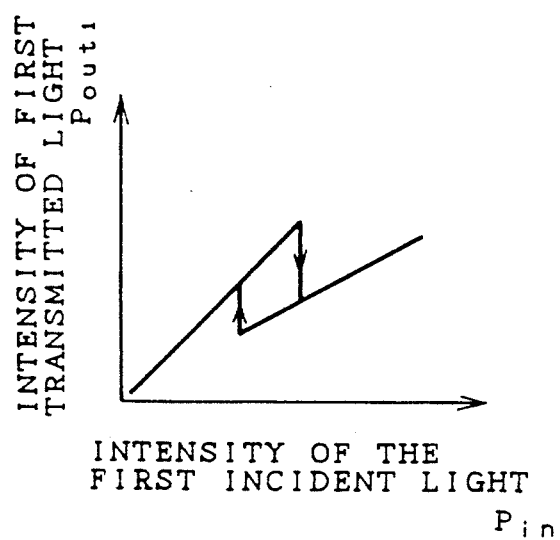
FIGS. 12A and 12B are characteristic diagrams each showing another relation between incident light intensity and transmitted light intensity relation in the nonlinear optical element according to the fifth embodiment.
Figure 12B:
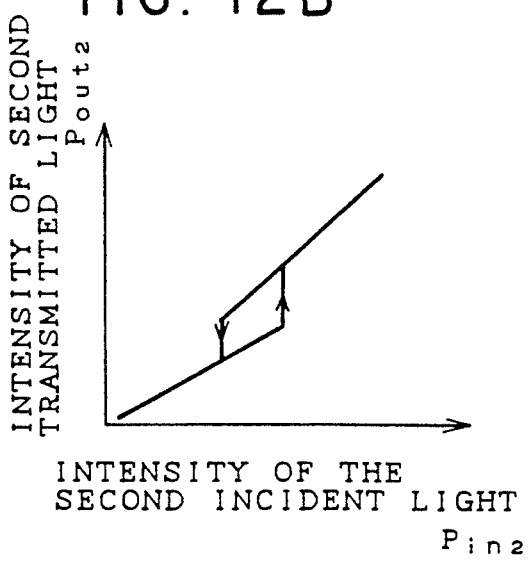

Further, if the nonlinear optical element of example 2 is used as the nonlinear optical element 23, such different input-output relations as shown in FIGS. 12A and 12B can be obtained by changing the wavelengths of the first and second incident lights.

Thus, in this example, in either or both of p- and n-type doped layers of a p-i-n photodiode having a light absorption layer of a quantum well structure in an intrinsic region (i layer) between the p- and n-doped layers, there is provided a barrier layer for obstructing the conduction of a majority carrier which is generated in the said light absorbing layer and transmitted toward each doped layer, or in either or both of such p- and n-type doped layers there is provided a barrier layer for switchwise changing the conduction of a majority carrier generated in the light absorbing layer and transmitted toward each doped layer, in accordance with a change in the magnitude of an electric field applied to the barrier layer, the p- and n-type doped layers being short-circuited, and in this method a first and second incident lights are input in such a manner as to avoid overlapping of the regions in which the carriers developed by the absorption of the first and second incident lights are spread by diffusion. Consequently, there can be obtained bistable characteristics each independently achieved with respect to the two incident lights without element isolation of the nonlinear optical element.

Although in the examples just described above the number of light inputs is two, also in the case of three light inputs, there can be obtained bistable characteristics each independently achieved by inputting these three lights so as to avoid overlapping of the regions in which carriers generated by the absorption of those incident lights are spread by diffusion.

EXAMPLE 6

Figure 13:
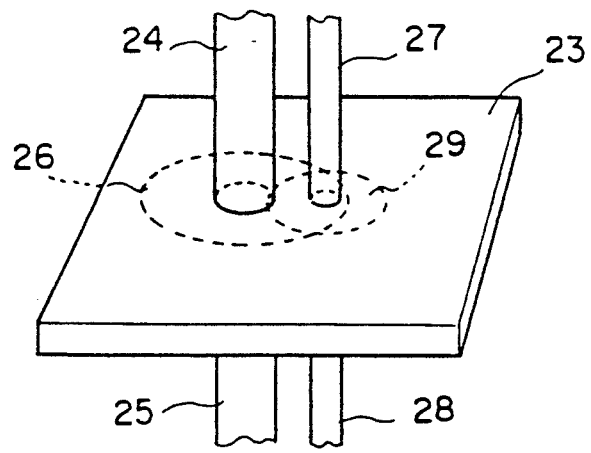
FIG. 13 is a schematic illustration showing a nonlinear optical element according to a sixth embodiment of the present invention.

FIG. 13 is a schematic illustration showing a method of using a nonlinear optical element according to example 6 of the present invention. In FIG. 13, the same reference numerals as in FIG. 10 represent the same components as in FIG. 10.

Figure 14A:
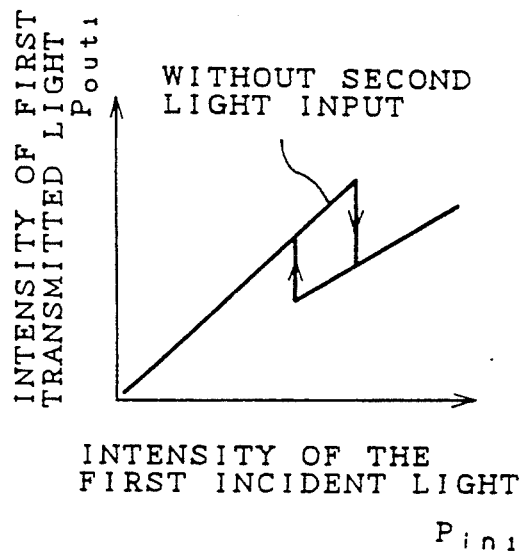
FIGS. 14A and 14B are characteristic diagrams each showing one relation between incident light intensity and transmitted light intensity relation in the nonlinear optical element according to the sixth embodiment.
Figure 14B:
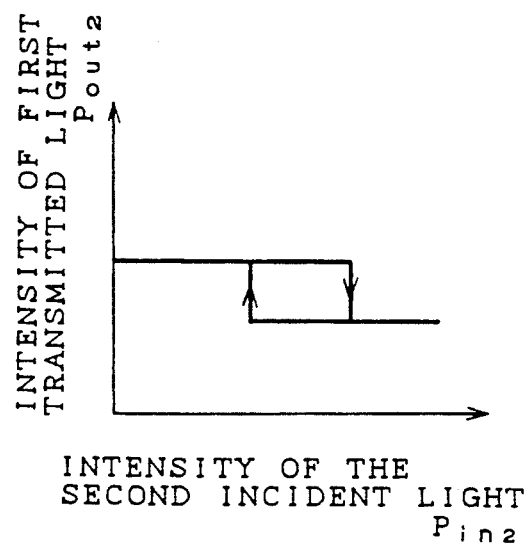

In this example 6, conversely to the above example 5, the second incident light 27 is input in the transverse diffusion region 26 of the carriers developed by the absorption of the first incident light 24. In this case, the input-output relation of the first incident light 24 is influenced by the second incident light 27. For example, in the case where the input-output relation of the first incident light 24 corresponds to such characteristic as shown in FIG. 14A, if the incident light intensity of the first incident light 24 is kept at a certain constant value while that of the second incident light 27 is changed, then the transmitted light intensity of the first incident light 24 changes as in FIG. 14B. In other words, the optical bistable characteristic of the first incident light 24 can be controlled by changing the incident light intensity of the second incident light 27.

Thus, in this example, in either or both of p and n-type doped layers of a p-i-n photodiode having a light absorbing layer of a quantum well structure in an intrinsic region between the p- and n-type doped layers, there is provided a barrier layer for obstructing the conduction of a majority carrier which is generated in the light absorbing layer and transmitted toward each doped layer, or in either or both of the p- and n-type doped layers there is provided a barrier layer for switchwise changing the conduction of a majority carrier generated in the light absorbing layer and transmitted toward each doped layer, in accordance with the magnitude of an electric field applied to the a barrier layer, the p- and n-type doped layers being short-circuited, and in this method the second incident light 27 is input into the region in which the carriers developed by the absorption of the first incident light are spread by diffusion, and the intensity of the second incident light 27 is changed. Consequently, the optical bistable characteristic of the first incident light 24 can be controlled by the second incident light 27.

Although in FIG. 13 the second transmitted light 28 is output relative to the second incident light 27, this constitution may be modified in such a manner that the second incident light 27 is wholly absorbed in the light absorbing layer and hence the second transmitted light 28 is not outputted.

Further, although in the embodiment described above the number of another incident light on the region where carriers generated by the absorption of one incident light are diffused is one, the number of such other incident light may be two or more.

EXAMPLE 7

Figure 15:
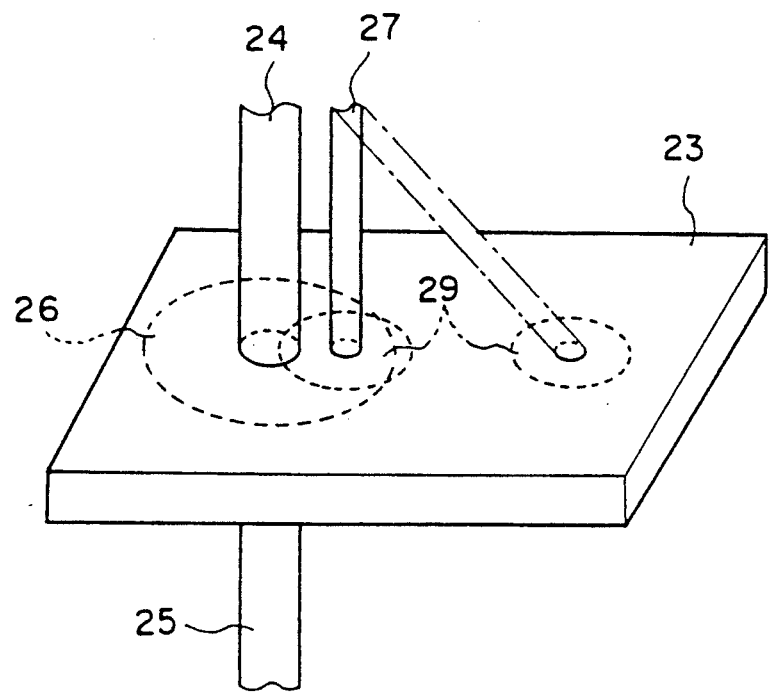
FIG. 15 is a schematic illustration showing a nonlinear optical element according to a seventh embodiment of the present invention.
Figure 16:
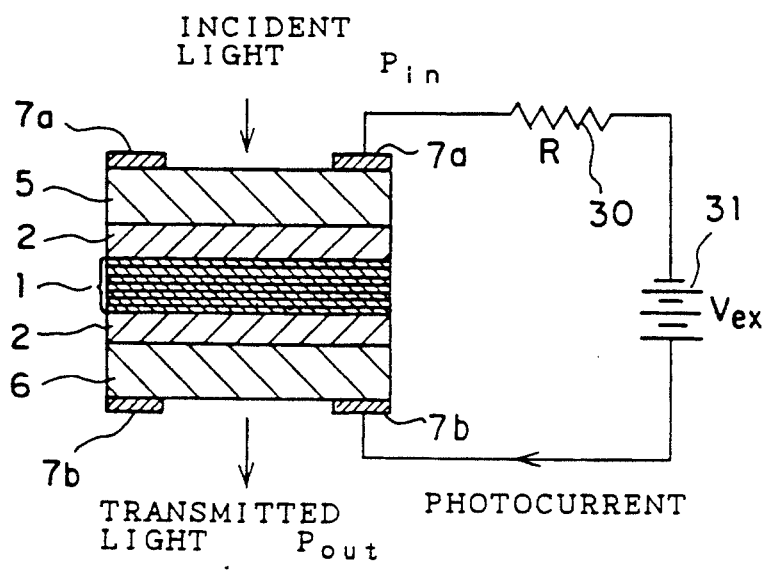
FIG. 16 is a sectional view of a conventional optical bistable device.
Figure 17:
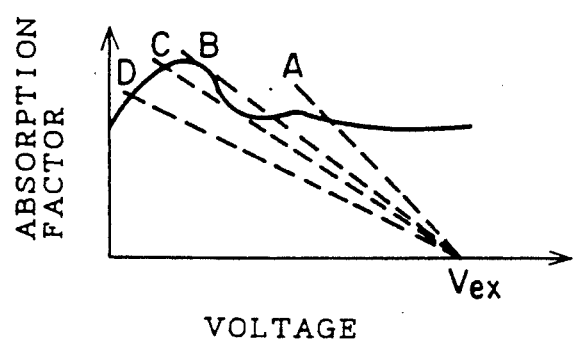
FIG. 17 is a characteristic diagram showing absorption of light in the conventional optical bistable device.
Figure 18:
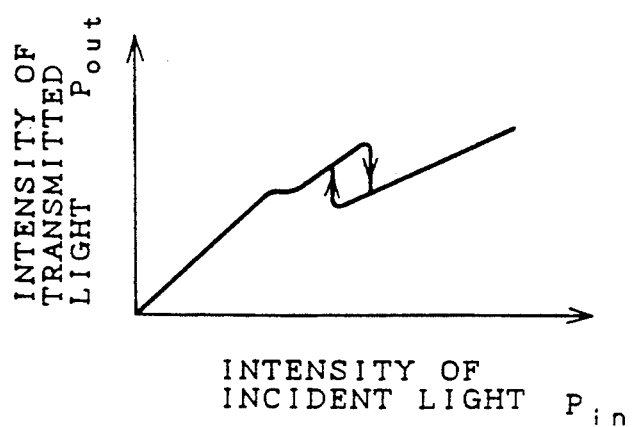
FIG. 18 is a characteristic diagram showing a relation between incident light intensity and transmitted light intensity in the conventional optical bistable device.

FIG. 15 is a schematic illustration showing a method of using a nonlinear optical element according to example 7 of the present invention. In FIG. 15, the same reference numerals as in FIG. 13 represent portions same as or corresponding to those in FIG. 13.

This embodiment 7 is different from the previous example 6 in that whereas in the example 6 the optical bistable characteristic relating to the first incident light 24 is controlled by changing the input intensity of the second incident light 27, the optical bistable characteristic of the first incident light 24 in this example 7 is controlled by changing the input place of the second incident light 27, namely the distance from the first incident light 24, while keeping the input intensity of the second light 27 constant. But, like the example 6, the input-output relation relative to the first incident light 24 can be controlled by another incident light.

As set forth above, upon input of light having a certain spot diameter, carriers generated by the absorption of light are spread not only within the light input portion but also to the surrounding area by a lateral diffusion. As a factor which determines the diffusion distance there is mentioned a carrier speed of passing through the barrier layer. Therefore, by changing, for example, the thickness of the barrier layer to change the carrier speed through the barrier layer, it is made possible to change the controllability of the second light for the optical bistable characteristic of the first light in the examples 6 and 7 (The thicker the barrier layer, the slower the speed.).

However, when the carrier speed of passing through the barrier layer is changed, the life of the carriers which are intercepted by the barrier layer and accumulated therein changes, so that the operating speed of the optical bistable element also changes. On the other hand, for example, if the thickness of the p-type AlGaAs layer 4 in FIG. 1, namely the thickness of the conductive layer between the light absorbing layer 1 and the barrier layer 3, is changed, it becomes possible to change the easiness of lateral diffusion of the carriers without greatly changing the operating speed, and hence it is possible to change such controllability of the second light for the optical bistable characteristic of the first light as set forth in the examples 6 and 7.

What is claimed is:

1. A nonlinear optical element using a p-i-n photo-diode structure which has a light absorbing layer of a quantum well structure in an intrinsic region between a p-type doped layer and an n-type doped layer, characterized by including:
    a barrier layer for obstructing the conduction of a multitude of carriers which are generated in said light absorbing layer and transmitted through each said doped layer, said barrier layer being provided in either or both of said p- and n-type doped layers; and
    electrodes for short-circuiting said p- and n-type doped layers.

2. A nonlinear optical element according to claim 1, wherein said light absorbing layer has a coupled quantum well structure.

3. A nonlinear optical element according to claim 1 or claim 2, wherein said barrier layer is a non-doped layer larger in band gap than said p- or n-type doped layer.

4. A nonlinear optical element using a p-i-n photo-diode structure which has a light absorbing layer of a quantum well structure in an intrinsic region between a p-type doped layer and an n-type doped layer, characterized by including:
    a barrier layer for switchwise changing the conduction of a multitude of carriers which are generated in said light absorbing layer and transmitted through each said doped layer, in accordance with a change in the magnitude of an electric field applied to the barrier layer, said barrier layer being provided in either or both of said p- and n-type doped layers; and
    electrodes for short-circuiting said p- and n-type doped layers.

5. A nonlinear optical element according to claim 4, wherein said barrier layer is a double barrier layer in each of whose constituent layers a multitude of carriers generate a resonant tunneling when a predetermined electric field is applied thereto.

6. A nonlinear optical element according to claim 4 or claim 5, wherein said light absorbing layer has a coupled quantum well structure.

7. A method of using a nonlinear optical element, said nonlinear optical element using a p-i-n photo-diode structure which has a light absorbing layer of a quantum well structure in an intrinsic region between a p-type doped layer and an n-type doped layer, said nonlinear optical element having a barrier layer for obstructing the conduction of a multitude of carriers which are generated in said light absorbing layer and transmitted through each said doped layer, said barrier layer being provided in either or both of said p- and n-type doped layers, or having a barrier layer which is provided in either or both of said p- and n-type carriers and which switchwise changes the conduction of a multitude of carriers generated in said light absorbing layer and transmitted through each said doped layer, in accordance with a change in the magnitude of an electric field applied to the barrier layer, and said nonlinear optical element further having electrodes for short-circuiting said p- and n-type doped layers,
    characterized in that, into a region wherein carriers generated by the absorption of light with respect to one beam-like incident light which is inputted into a predetermined region of the nonlinear optical element, are spread by diffusion, there are inputted one or plural other beam-like incident lights.

8. A method of using a nonlinear optical element according to claim 7, wherein the distance between said one beam-like incident light and said other beam-like incident light(s) is changed.

* * * * *